US007293691B2

(12) United States Patent
Rossmeisl et al.

(10) Patent No.: US 7,293,691 B2
(45) Date of Patent: Nov. 13, 2007

(54) ELECTRONIC SUBSTRATE PRINTING

(75) Inventors: Mark Rossmeisl, Franklin, MA (US);
Frank John Marszalkowski, Jr.,
Cumberland, RI (US); Joseph A. Perault, Natick, MA (US)

(73) Assignee: Speedline Technologies, Inc., Franklin, MA (US)

( * ) Notice: Subject to any disclaimer, the term of this patent is extended or adjusted under 35 U.S.C. 154(b) by 444 days.

(21) Appl. No.: 10/346,803

(22) Filed: Jan. 17, 2003

(65) Prior Publication Data

US 2004/0142099 A1   Jul. 22, 2004

(51) Int. Cl.
*B23K 31/00* (2006.01)
*B05D 5/12* (2006.01)
(52) U.S. Cl. .................................. 228/248.1; 427/96.1
(58) Field of Classification Search ................ 228/102, 228/49.6; 427/96, 282
See application file for complete search history.

(56) References Cited

U.S. PATENT DOCUMENTS

| 4,926,546 | A | * | 5/1990 | Polczynski et al. ........... 29/840 |
| RE34,615 | E | | 5/1994 | Freeman |
| 5,436,028 | A | | 7/1995 | Becher et al. |
| 5,882,720 | A | * | 3/1999 | Legault et al. ................. 427/8 |
| 6,374,729 | B1 | | 4/2002 | Doyle |
| 2002/0133937 | A1 | | 9/2002 | Mochida et al. |

FOREIGN PATENT DOCUMENTS

| GB | 2 360 014 A | | 9/2001 |
| JP | 7-148906 | * | 6/1995 |

OTHER PUBLICATIONS

Yuji, Noda, Translation to JP 7-148906, 5 pages.*
Patent Abstracts of Japan; JP 04091952 (Matsushita Electric Ind. Co. Ltd.); Mar. 25, 1992; 1 pg.
Patent Abstracts of Japan; JP 07148906 (NEC Corp.); Jun. 13, 1995; 1 pg.
Patent Abstracts of Japan; JP 2002240240 (Noda Screen:KK); Aug. 28, 2002; 1 pg.
International Search Report for PCT/US2004/001177 mailed Jun. 16, 2004.
Patent Abstracts of Japan; JP 10089494 A (Tokyo Shibaura Electric Co.); Mar. 4, 1989; 1 pg.

* cited by examiner

*Primary Examiner*—Kiley Stoner
(74) *Attorney, Agent, or Firm*—Lowrie, Lando & Anastasi, LLP

(57) ABSTRACT

A system for depositing solder paste on a print window of a printed circuit board through a stencil includes a housing providing a printing chamber, a depositor configured to move relative to the housing and to deposit the solder paste, a support device disposed in the printing chamber and configured to receive the circuit board and to selectively hold the circuit board stationary relative to the housing, a loading mechanism configured to receive the circuit board and to transport the circuit board along a second direction to the support device, a controller coupled and configured to control dispensing of the solder paste by the depositor and the transporting of the circuit board by the loading mechanism, and a rotational apparatus coupled to the support device and configured to rotate the support device, where the controller is configured to cause the rotational apparatus to rotate the support device more than about 10° and to cause the depositor to deposit solder paste onto the circuit board after the rotational device has rotated the support device more than about 10°.

7 Claims, 9 Drawing Sheets

ELECTRONIC SUBSTRATE PRINTING

FIELD OF THE INVENTION

The invention relates to printed-circuit-board manufacturing and more particularly to printing large circuit boards.

BACKGROUND OF THE INVENTION

The manufacturing of circuit boards involves many processes, one of which is screen printing solder paste and adhesives onto printed circuit boards so that electronic components can be placed onto the boards. Screen printing of solder paste is typically performed in a printer. The circuit board is mounted on a conveyor for insertion into the printer. The board is moved into the printer for printing of the solder paste onto the circuit board.

To apply solder paste and surface mount components to a surface of a circuit board, several actions are taken using a stencil. The stencil has one or more (typically more) apertures that define a pattern corresponding to a pattern of pads already disposed on the circuit board. The stencil is placed substantially parallel to the surface of the board to be printed and the apertures are aligned with the pattern on the substrate surface. The solder paste or other material to be deposited is placed on top of the stencil for deposition into the apertures and onto the board. Once the apertures are filled with material, excess material may be removed from the top of the stencil, using for example a squeegee, so that substantially all of the material that remains is in the apertures. The stencil is separated from the board and the surface tension between the board and the material causes most of the material to stay on the board.

Circuit boards come in a variety of standard sizes and solder printers are typically configured to accommodate a range of various sizes up to and including boards of about 24"×20". For example, printers exist that can accommodate boards up to about 24"×20", up to about 0.5" thick, and up to about 80 pounds. Equipment, e.g., for holding and positioning the boards, and for applying solder paste to the boards, influence the sizes of boards that a printer can accommodate. For example, squeegees for applying solder paste are typically about 24" to accommodate a 24" substrate while providing desirable characteristics for spreading the solder paste. Some specialized printers exist for printing on larger substrates such as 36" substrates. Some concerns with accommodating larger boards is that quality may degrade, and/or solder paste waste may increase, compared to printing smaller boards, e.g., due to using larger non-standard squeegees. Another concern regarding the size of boards that a printer can accommodate is the width of the printer itself. As the printer gets wider, a production line using the printer gets longer. As production lines are often tightly fit to available space, widening a printer may have significant practical implications upon a production line using the printer.

SUMMARY OF THE INVENTION

In general, in an aspect, the invention provides a system for depositing solder paste on a print window of a printed circuit board through a stencil. The system includes a housing providing a printing chamber, a depositor configured to move relative to the housing and to deposit the solder paste, a support device disposed in the printing chamber and configured to receive the circuit board and to selectively hold the circuit board stationary relative to the housing, a loading mechanism configured to receive the circuit board and to transport the circuit board along a second direction to the support device, a controller coupled and configured to control dispensing of the solder paste by the depositor and the transporting of the circuit board by the loading mechanism, and a rotational apparatus coupled to the support device and configured to rotate the support device, where the controller is configured to cause the rotational apparatus to rotate the support device more than about 10° and to cause the depositor to deposit solder paste onto the circuit board after the rotational device has rotated the support device more than about 10°.

Implementations of the invention may include one or more of the following features. The rotational apparatus is configured to rotate the support device about 90°. The rotational apparatus is configured to rotate the support device about 90° at a first rate in a coarse adjustment mode and is configured to rotate the support device at a second rate, slower than the first rate, in a fine adjustment mode. The support device includes a plurality of elongated guides for supporting bottom surfaces of edges of the circuit board, the system further comprising a flattening apparatus comprising a plurality of elongated members configured to retractably engage top surfaces of the edges of the circuit board and, in combination with the guides, to squeeze the edges of the circuit board. The controller is configured to cause the elongated members to be retracted before the depositor deposits the solder paste onto the circuit board. The depositor has a printable length, and wherein the controller is configured to cause the rotational apparatus to rotate the support device more than about 10° in response to determining that a dimension of the print window substantially parallel to the direction of travel of the circuit board is greater than the printable length.

In general, in another aspect, the invention provides a method of printing a circuit board with solder paste using a solder printer. The method includes transporting the circuit board, that includes a print region that is to receive the solder paste, to a printing chamber of the solder printer along a first direction of travel, rotating the circuit board greater than about 10°, moving the circuit board into close proximity with the stencil with the print region in a desired relationship with respect to the stencil, and printing the solder paste onto the circuit board by inserting the solder paste through the stencil onto the print region of the circuit board.

Implementations of the invention may include one or more of the following features. The rotating rotates the circuit board about 90°. The method further includes pressing edges of the circuit board before the printing. The rotating is initially rotating, the method further comprising further rotating the circuit board after the printing such that the circuit board is oriented substantially similarly as the board was situated before the initial rotating. The further rotating rotates the board substantially 90° in a direction opposite to that of the initial rotating. The initial and further rotating are performed at a first speed that is faster than a second speed used to rotate the circuit board, if at all, to fine tune alignment of the circuit board with the stencil. The method further includes determining whether a dimension of the print region substantially parallel to the first direction of travel is greater than a printable length associated with the printer, wherein the rotating is performed in response to determining that the dimension of the print region substantially parallel to the first direction of travel is greater than the printable length.

Implementations of the invention may also include one or more of the following features. The circuit board is a first circuit board and the print region is a first print region, the method further including receiving a second circuit board for printing, transporting the second circuit board, that includes a second print region that is to receive the solder paste, to the printing chamber of the solder printer along the first direction of travel, determining that a dimension of the second print region substantially parallel to the first direction of travel is no greater than the printable length associated with the printer, moving the second circuit board into close proximity with the stencil with the print region in a desired relationship with respect to the stencil without rotating the second circuit board more than about 10°, and printing the solder paste onto the second circuit board by inserting the solder paste through the stencil onto the second print region of the second circuit board.

In general, in another aspect, the invention provides a printer for printing a circuit board with solder paste through a stencil onto a print region of the circuit board. The printer includes a housing providing a printing chamber, an input configured to receive and transport the circuit board along a first direction of travel into the printing chamber, a support device disposed in the printing chamber and configured to receive the circuit board and to selectively hold the circuit board stationary relative to the housing, a solder paste depositor disposed in the printing chamber and configured to move relative to the housing in a second direction of travel substantially perpendicular to the first direction of travel and to deposit the solder paste, a rotational apparatus configured to rotate the support device and the circuit board, and a controller coupled to and configured to control the depositor, the input, the depositor, and the rotational apparatus to: transport the circuit board to the printing chamber along the first direction of travel; rotate the circuit board about 90°; move the circuit board into close proximity to the stencil with the print region in a desired relationship with respect to the stencil; and print the solder paste onto the circuit board by moving the depositor in the second direction of travel while dispensing the solder paste through the stencil onto the print region of the circuit board.

Implementations of the invention may include one or more of the following features. The printer further includes a plurality of retractable flattening bars, wherein the controller is configured to cause the flattening bars to press on a top surface of the circuit board and to retract from the top surface before the solder paste is printed onto the circuit board. The controller is further configured to cause the rotational apparatus to rotate the support device and the circuit board about −90° after the solder is printed on the circuit board. The depositor in conjunction with the stencil determine a printable length associated the printer, and wherein the controller is configured to rotate the circuit board about 90° only if a dimension of the print region substantially parallel to the first direction of travel is greater than the printable length.

In general, in another aspect, the invention provides a printer for depositing solder paste through a stencil, the printer including a housing and means, coupled to the housing and having a printable length substantially perpendicular to a print direction, for printing solder paste on a circuit board, that has a print window length substantially parallel to a direction of receipt of the board that is greater than the printable length, the circuit board being for receipt of the solder paste from the printing means in the print window.

Implementations of the invention may include one or more of the following features. The printing means is configured to rotate the circuit board approximately 90° inside the housing prior to deposition of the solder paste. The printing means is configured to position the circuit board such that a width of the print window that is no greater than the printable length is disposed substantially parallel to the printable length.

Various aspects of the invention may provide one or more of the following advantages. Substrates larger than 24" may be accommodated within existing printer footprints. Substrates larger than 24" in one dimension can be printed using a squeegee that is about 24". Larger-than-normal circuit boards can be printed with solder without using a custom squeegee, with better quality/control than if a large, custom squeegee is used, and/or with reduced solder paste waste at changeover/stencil cleanup than if a custom, larger-than-normal squeegee is used. Standard printers and printer accessories such as squeegee blades and stencil wiper components can be used to print larger-than-normal circuit boards. Larger circuit boards can be solder printed using semi-standard stencil frames having one dimension be about 29". Larger-than-normal circuit boards can be solder printed while using shorter squeegee blades, less print pressure down force, lighter and smaller squeegee blades, and less paste than using current techniques. Relatively long circuit boards can be solder printed in a non-specialized machine that can accommodate smaller circuit boards such that the machine need not sit idle when no relatively long circuit boards need to be processed. Larger and heavier-than-normal circuit boards, e.g., up to 80 pounds and 36" in length, can be printed by using a printer implementing the invention than if existing printers are used. A production line for large circuit boards that uses a printer implementing the invention can be shorter than a production line using an existing large-board printer.

These and other advantages of the invention, along with the invention itself, will be more fully understood after a review of the following figures, detailed description, and claims.

BRIEF DESCRIPTION OF THE FIGURES

FIGS. 5-8 are perspective views of the circuit board shown in FIGS. 3-4 being rotated, aligned, lifted, and printed on.

DETAILED DESCRIPTION OF PREFERRED EMBODIMENTS

Embodiments of the invention include printers configured to print circuit boards of relatively long lengths that have widths shorter than their lengths. The boards are loaded into a printer, rotated 90°, printed with solder paste, rotated back 90°, and expelled from the printer. The boards can be printed using equipment designed for printing swaths that are smaller than the board's length. The boards can be printed using printers with lengths in the direction of board flow that are the same as printers for printing shorter-length boards that are not rotated before printing. Other embodiments are within the scope and spirit of the invention.

Figure 1:
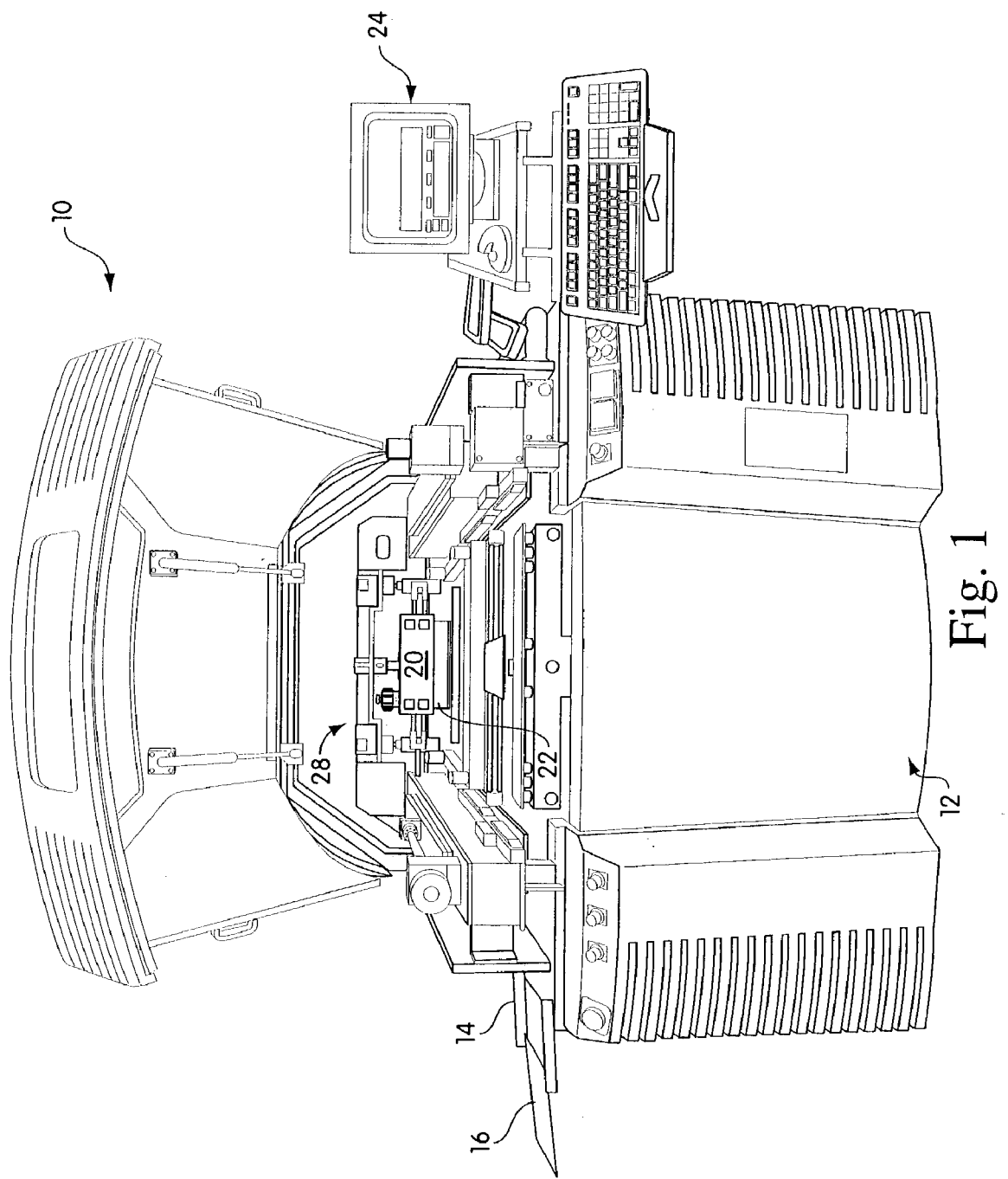
FIG. 1 is a front perspective view of a solder printer for printed circuit boards.

Referring to FIG. 1, a printer 10 includes a housing 12, a rail feed mechanism 14 for carrying and loading a circuit board 16, a work table 18 (FIG. 2), a solder-paste-depositing mechanism 20, shown here as a print head that includes multiple squeegees 22 (only one shown in FIG. 1), a control computer 24, and a rail output mechanism (not shown), similar to the rail feed mechanism 14, for carrying and expelling the board 16. The circuit board 16 contains circuit portions in the form(s) of metal contacts, pads, lead lines, and/or transmission lines to be connected to circuit components and to help connect circuit components, that will eventually be attached to the board 16, together. The controller 24 is configured to execute one or more stored computer-readable, computer-executable software programs to perform functions described below. The printer 10 is configured to load the board 16, print solder paste on the board 16 through a stencil 17 (FIGS. 6-7) that determines what portions of the board 16 receive the paste, and output the board 16 for further processing. Such further processing may include placing of circuit components on the board 16 and heating of the board 16 to solder the circuit components to the board 16. The feed mechanism 14 and the output rail mechanism are configured to load the board 16 into, and unload the board 16 from, the printer 10.

Figure 8:
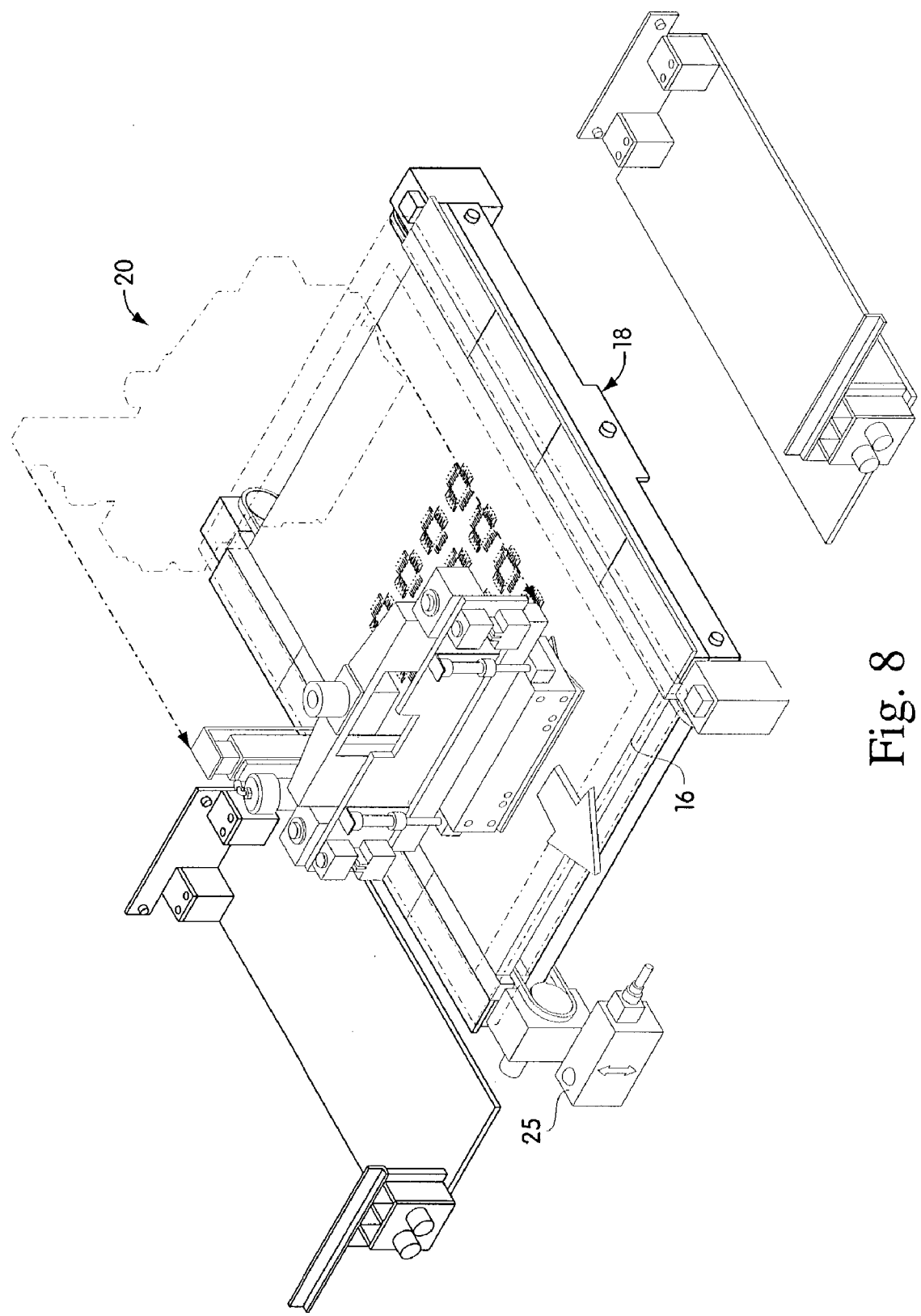

The depositor 20 is configured to deposit solder paste through apertures in a stencil 17 (FIG. 6) onto the circuit board 16. Although the depositor 20 is shown as a print head with squeegees 22, other configurations are acceptable, such as a Rheometric pump with blades (see U.S. Pat. No. 5,947,022), enclosed print heads, etc. The depositor 20 is connected to an appropriate means for moving the depositor 20 under control of the controller 24 in a print direction (FIG. 8; or the opposite direction than as shown in FIG. 8). The depositor 20 is preferably sized in accordance with the size of a printing chamber 28, which is sized to accommodate predetermined sizes of stencils. The stencils typically have a foil portion in which the apertures are formed. Typically, stencil frames measure 29" perpendicular to the print direction, with the foil portion measuring about 24" perpendicular to the print direction. The depositor 20 is preferably configured to deposit solder across an entire maximum length of the foil in a direction perpendicular to the direction of travel of the depositor 20. The depositor 20 may, however, be configured to deposit solder paste over a larger or smaller length.

The printer 10 has a printable length that is the length perpendicular to the print direction that may be printed with solder paste from the depositor 20 through the stencil 17. Preferably, the depositor 20 is configured to deposit solder over the full distance of the foil, e.g., 24" perpendicular to the print direction. Thus, as shown, the squeegees 22 extend the full length 100 (FIGS. 3 and 6) of an applicator portion of the depositor 20. Also, the maximum printable length of the depositor 20 is preferably parallel to the length 100 of the depositor 20, and thus the maximum printable length is used if the print direction is perpendicular to the length 100.

Figure 3:
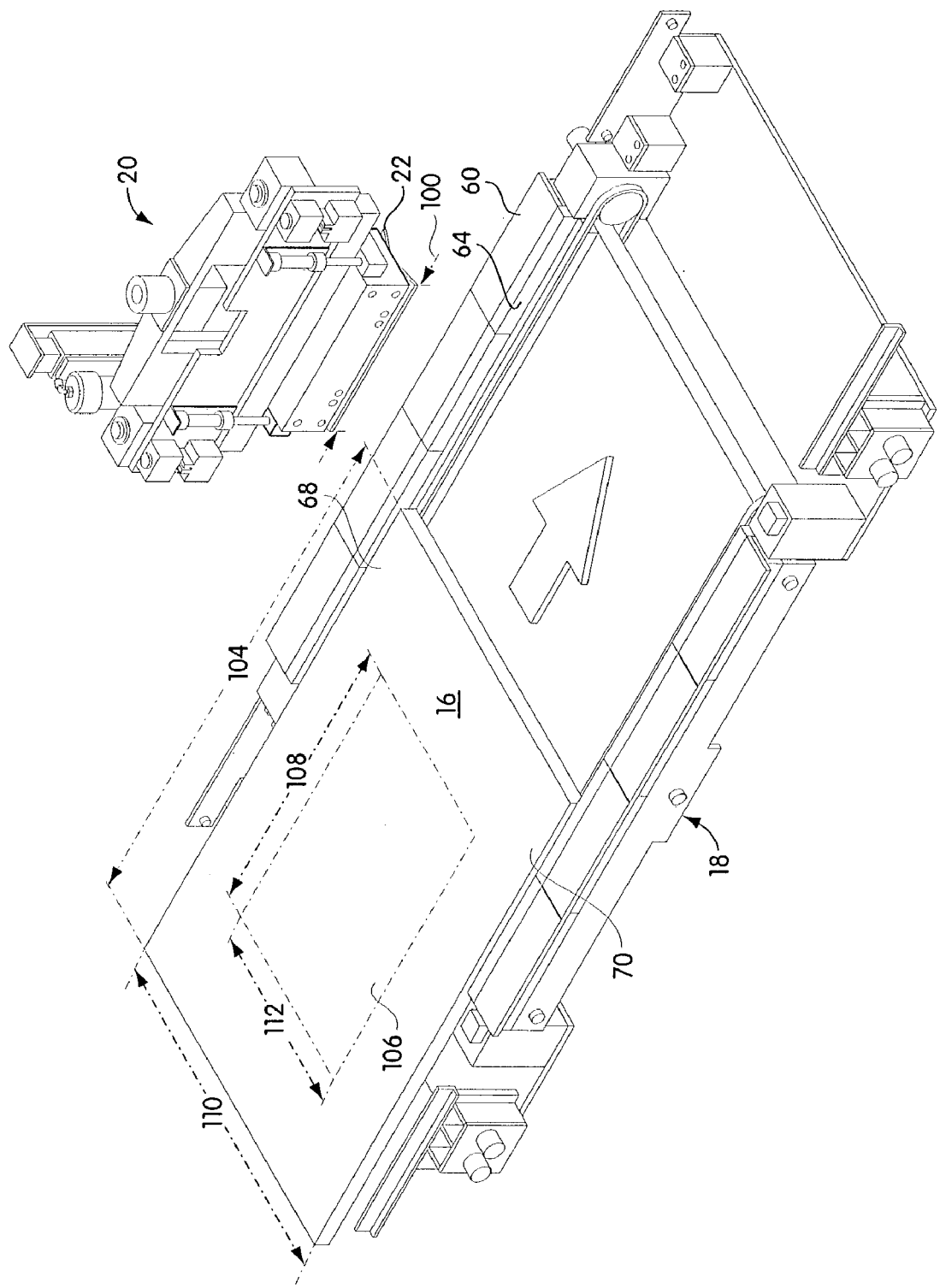
FIG. 3 is a perspective view of a relatively large circuit board being loaded onto a portion of the positioner system shown in FIG. 2.

Referring also to FIG. 3, the circuit board 16 is a relatively large circuit board having a length 104 longer than about 24". This circuit board is larger than normal in that it is longer than standard boards sizes that can be accommodated by non-custom/specialized printers. For example, the length 104 of the board 16 may be longer than the length 100 of the depositor 20. More particularly, a print window 106 of the board 16 that is to be printed on may have a length 108 (i.e., dimension in the direction parallel to board travel) that is longer than the printable length of the printer 10. The window 106 is shown as a rectangle although this is not required. A width 110 of the board 16 may be smaller than the length 100 of the depositor 20, and preferably a width 112 of the window 106 is equal to or less than the printable length of the printer 10. The circuit board 16 can have any of a variety of lengths, widths, and thicknesses, but preferably the length 104 is less than about 36" and more than about 6", the width 110 is preferably less than about 24" and more than about 6", and a thickness of the board 16 is preferably between about 0.062" and about 1". The circuit board 16 preferably weighs less than about 80 pounds. With such dimensions and weight, the printer 10 can be an Ultraflex® 3000 printer made by Speedline Technologies of Franklin, Mass., modified to accommodate greater weights of boards and to flatten the boards, and programmed to rotate at least boards larger than 24" in length by about 90° prior to printing. The printer could be so modified without increasing the housing dimension along the axis of travel of the board 16 into and out of the printer 10, and thus can be substituted for an unmodified Ultraflex® 3000 printer without affecting the length of a production line that includes the unmodified Ultraflex® 3000 printer.

Figure 2:
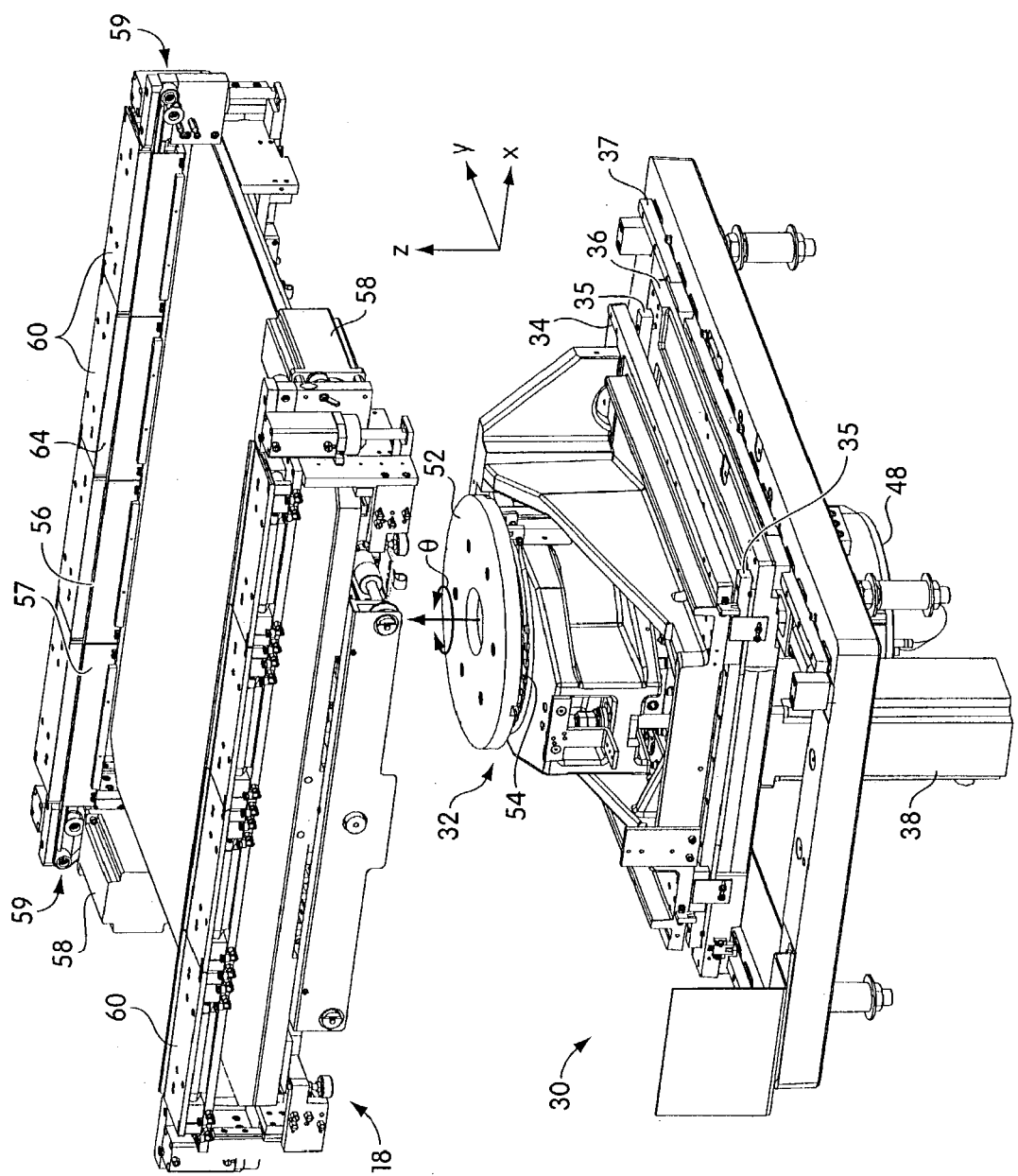
FIG. 2 is a perspective view of a circuit board positioner system and table of the printer shown in FIG. 1.
Figure 6:
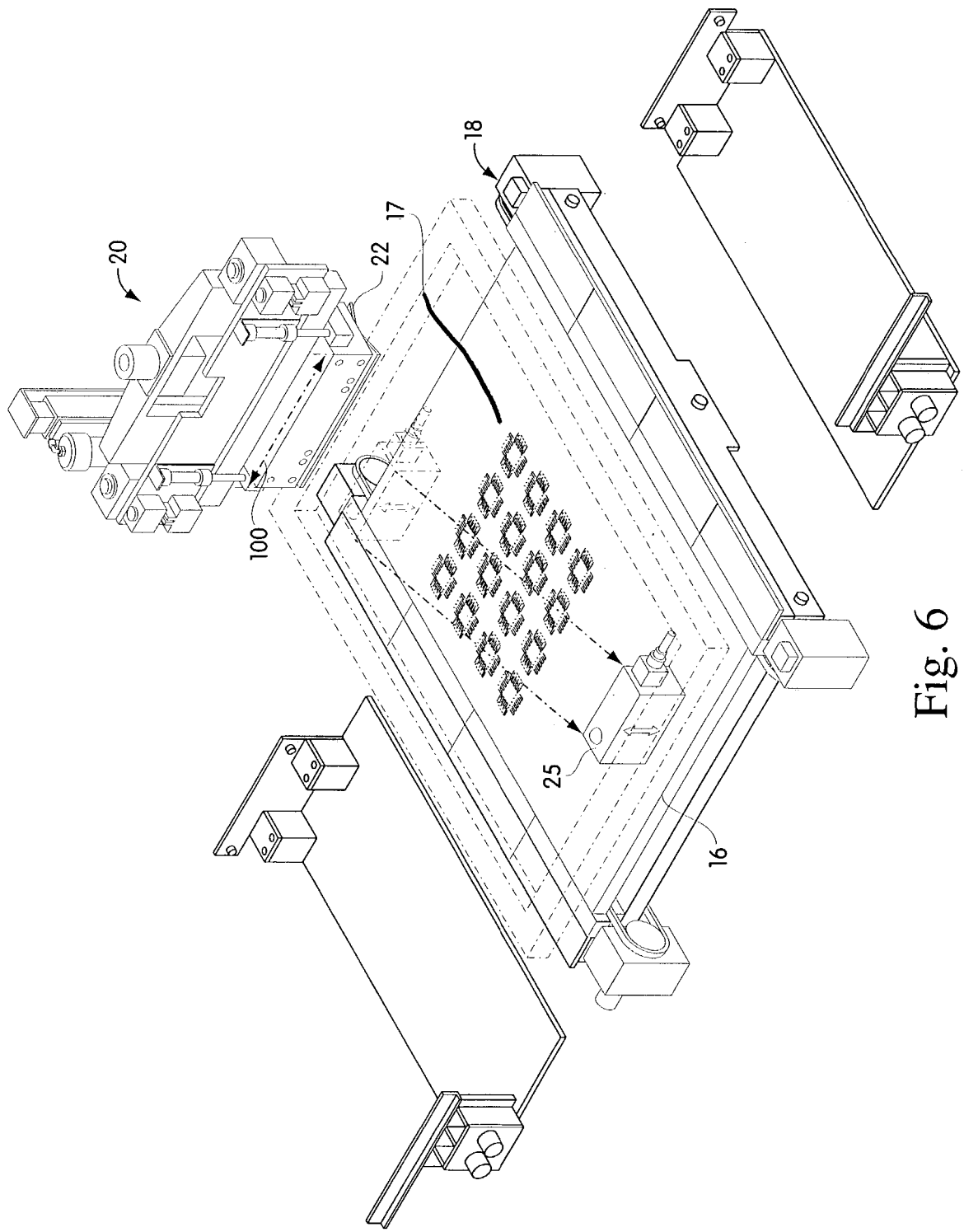
Figure 7:
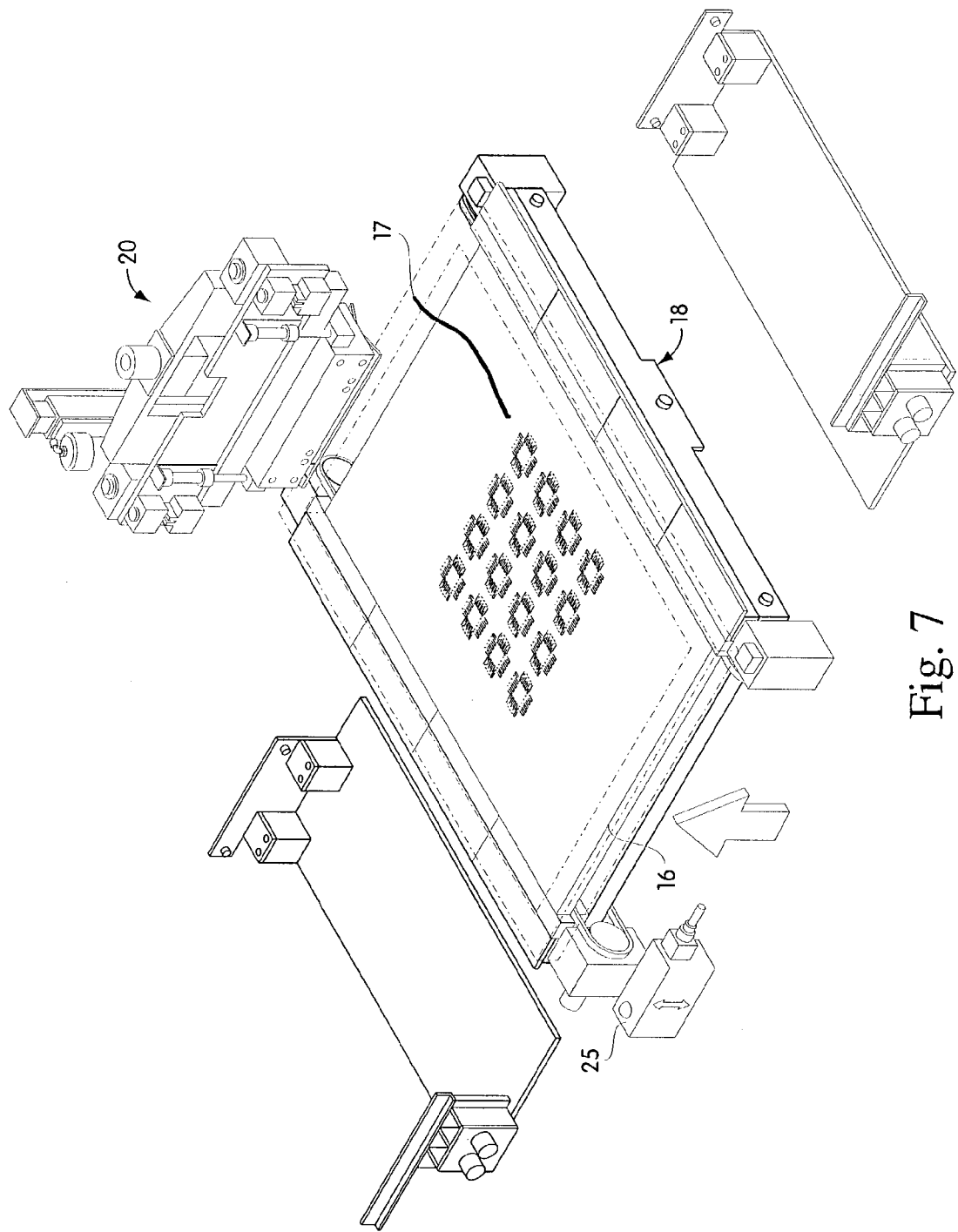

Referring also to FIGS. 1-2, the printer 10 further includes a positioning system 30, to be coupled to the work table 18, that includes a theta motor 32, an x-drive (not shown), a y-drive (not shown), and a z-drive 38. The positioning system 30 is configured to position the board 16 in the printing chamber 28 for receiving solder from the depositor head 20. The positioning system 30 is configured to respond to commands from the controller 24 to orient the table 18, that holds the circuit board 16, within the printing chamber 28 at a desired location and angle for receiving the solder from the depositor 20. The commands received will depend upon information received by the controller 24 from a camera 25 (FIG. 6) that provides information as to the relative positions of the circuit board 16 and the stencil 17 (FIGS. 6-7). The x-drive includes a motor for moving an x-platform 34 along x-rails 35 and the y-drive includes a motor for moving a y-platform 36 along y-rails 37 in the x and y directions respectively. The x platform 34 holds a z-tower 48 from moving relative to the x platform in the x and y directions. The z-drive 38 is configured to raise and lower the z-tower 48 along the z axis. The theta motor 32 is coupled to the z-tower 48 and the work table 18, and thus adjustments in z affecting the theta motor 32 also affect the work table 18, and in turn the circuit board 16.

The theta motor 32 is configured to rotate the work table 18 in theta parallel to the x-y plane as indicated. The motor 32 has an upper half 52 and a lower half 54. The upper half 52 is connected (e.g., bolted) to the work table 18 and the lower half 54 is connected (e.g., bolted) to the z-tower 48. The motor 32 is a servo motor configured to have the two halves 52, 54 rotate about the z-axis with respect to each other. As the z-tower 48 is inhibited from rotational movement about the z-axis by the x platform 34, rotation, of the halves 52, 54 with respect to each other causes the upper half 52, that is connected to the table 18, to rotate in theta about the z-axis.

The theta motor 32 is configured to rotate the work table 18 in response to commands from the controller 24 in both coarse and fine modes. In the coarse mode, the motor 32 can rapidly rotate the work table 18, that holds the circuit board 16, about 90° either clockwise or counterclockwise for positioning the board 16 for receiving solder paste or repositioning the board to be output from the printer 10. In the fine mode, the motor 32 responds to commands from the controller 24 to adjust the table 18 in theta within very small tolerances to align the board 16 with the stencil 17 through which solder paste will be applied to the board 16. The motor 32 can rotate the table 18, and thus the board 16, much faster in the coarse mode than in the fine mode.

Figure 4:
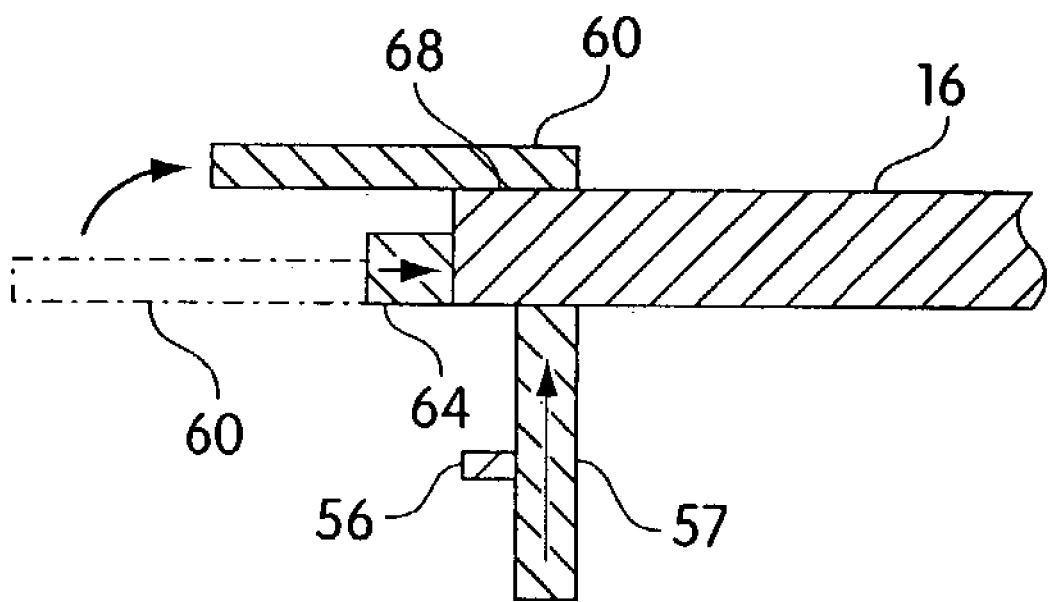
FIG. 4 is a schematic side view of a circuit board having its edges flattened by flattening bars shown in FIG. 2.

Referring to FIGS. 2-4, the work table 18 includes two belts 56 (only one shown), retractable flattening bars 60, and two clamping bars 64 (only one shown). The belts 56 are driven by belt motors 58 over pulleys 59 and to frictionally engage bottom edges of the board 16 to transport the circuit board 16 into the printer 10 (FIG. 1) with the clamping bars 64 guiding the board 16. At least one, and preferably one, of the clamping bars 64 is configured, and coupled to an appropriate driver, to move toward the other clamping bar 64 to hold and support the board 16 between the clamping bars 64. The retractable flattening bars 60 are connected to appropriate drivers/motors for moving the flattening bars 60 as desired in response to commands from the controller 24. The flattening bars 60 are configured to extend upward and over the edges 68, 70 of the board 16 and to rest on tops of the edges 68, 70 of the board 16. Board support blades 57 are configured to move upward to raise the board 16 off the belts 56 and into contact with the flattening bars 60 to squeeze the board edges 68, 70 between the flattening bars 60 and the supports 57, as shown in FIG. 4, to help flatten the board 16. The flattening bars 60 are further configured to be retracted into their retracted positions shown in FIG. 3 (and in FIG. 4 in dashed lines) while the board 16 is further processed, e.g., by having solder paste printed on it from the depositor 20.

Figure 9:
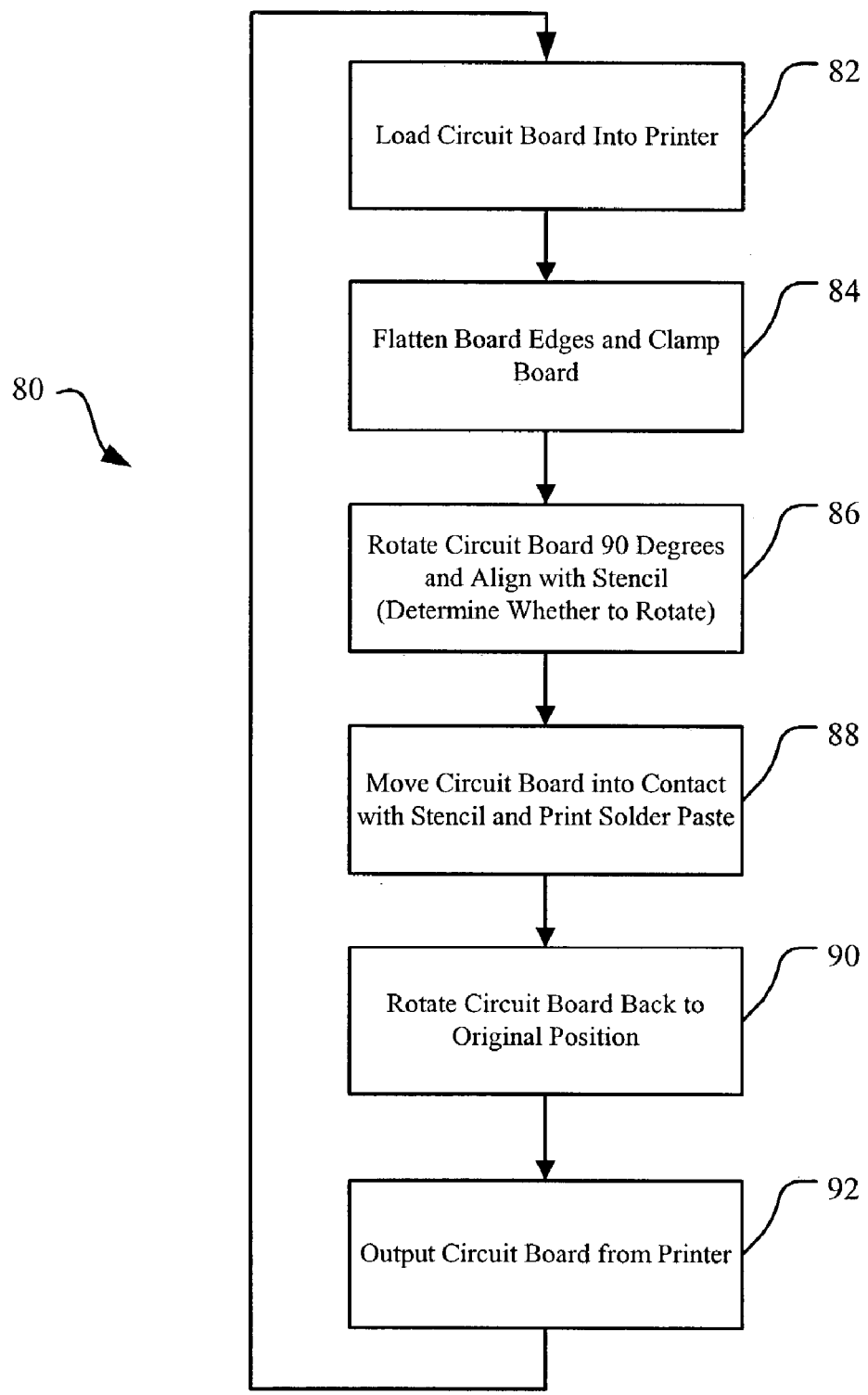
FIG. 9 is a block flow diagram of a process of printing solder on the circuit board as shown in FIGS. 3-8.

In operation, referring to FIG. 9, with further reference to FIGS. 1-8, a process 80 for solder printing the circuit board 16 using the printer 10 includes the stages shown. The process 80, however, is exemplary only and not limiting. The process 80 can be altered, e.g., by having stages added, removed, or rearranged.

At stage 82, the circuit board 16 is loaded into the printer 10, and more specifically into the chamber 28. The rail feed mechanism 14 carries the board 16 along the board's edges into the printing chamber 28. As shown in FIG. 3, the board 16 rides along the belts 56 into the chamber 28 and the board 16 is stopped.

At stage 84, the board 16 is flattened along its edges 68, 70. As indicated in FIG. 4, the flattening bars 60 move up and over the edges 68, 70 of the board 16. The flattening bars 60 extend about ¼" over the edges 68, 70 of the board 16. The support blades 57 lift the board 16 off the belts 56 and into contact with the flattening bars 60 and the board edges 68, 70 are squeezed by the flattening bars 60 and the supports 57 in the z-axis. The flattening bars 60 retract and the clamping bars 64 (although only one may move) squeeze the board 16 in the x-y plane. As indicated in FIG. 4, the clamping bar 64 moves inward to clamp the board 16 such that the board 16 is held by the clamping bars 64 and supported by the support blades 57.

Figure 5:
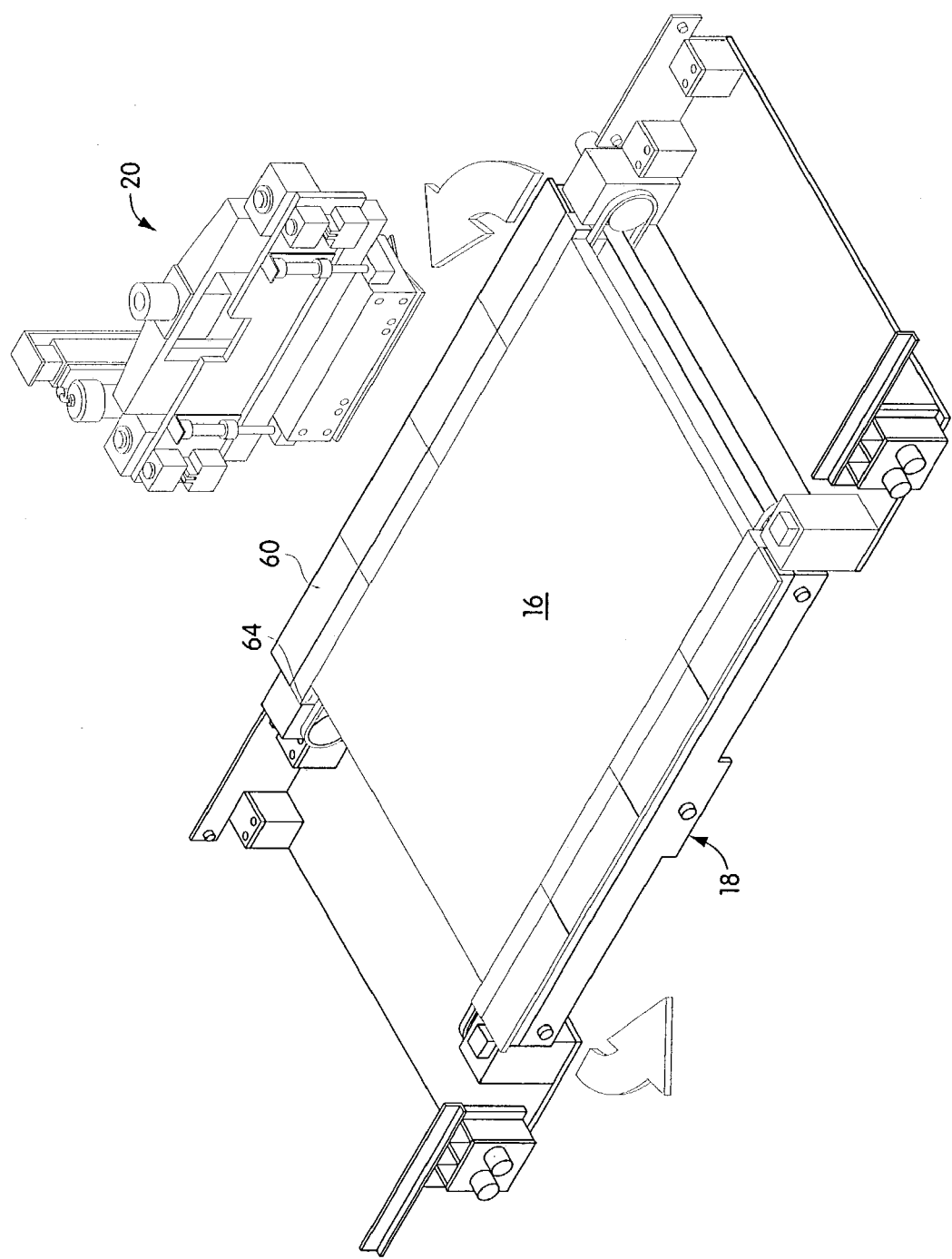

At stage 86, the work table 18, that holds the board 16, is rotated 90° and x, y, and theta (Θ) fine adjustments are made. As shown in FIGS. 5-6, the board 16 is rotated in coarse adjustment mode by the servo motor 32 under direction of the controller 24. The camera 25 is moved between the circuit board 16 and the stencil 17 to show fiducial marks on the board 16 and the stencil 17. The controller 24, depending on the relative positions of the fiducial marks, provides commands to the x-driver, the y-driver, and the theta motor 32 as appropriate to fine tune the relative positioning of the board 16 with respect to the stencil 17. When positioned as desired, the depositor 20 will be able to print solder paste into the entire print window 106 (e.g., the width 112 of the window 106 will be substantially parallel to the printable length of the depositor 20).

A determination can be made as to whether the 90° rotation is desirable/needed. For example, the length 104 of the board 16 can be determined and if the length 104 is longer than the printable length of the printer 10, then the board 16 can be rotated. Alternatively, the length 108 of the print window 106 of the circuit board 16 may be determined (e.g., using the camera 25) and compared against the printable length of the printer 10. If the length 108 of the window 106 is longer than the printer's printable length, then preferably the board 16 is rotated about 90° in response to a command from the controller 24 to the motor 32 (thus indicating that the print window length 108 exceeds the printer's printable length), and is not rotated 90° otherwise. Further, the printer 10 may be configured such that the board 16 is rotated about 90° without a command from the controller 24 to the motor 32. For example, all received boards may be rotated about 90° if the printer is programmed to handle a series of large boards 16 and the motor 32 automatically rotates the board 16 in response to an indication that the board 16 has been received by the table 18. In this case, the command is implicit and the indication that the board 16 has been received serves as an indication that a print window larger than the printable length of the printer 10 is present. Alternatively, the printer 10 may be configured such that the board 16 is rotated about 90° always, or at least without a command from the controller 24 to the motor 32 or other indication that the window length 108 exceeds the printer's printable length.

At stage 88, the board 16 is moved along the z axis (FIG. 7) into contact with the stencil 17 and the depositor 20 is moved over the stencil 17 (FIG. 8) to deposit solder paste on the circuit board 16. The stencil 17 can have a standard 29" width for a circuit board with a 24" width. The depositor 20 travels along the length of the circuit board 16 perpendicular to the direction of travel of the circuit board 16 through the printer 10. If the depositor 20 is a print head using squeegees, as shown in FIG. 1, then the solder paste is deposited on the stencil 17 between the leading and trailing squeegees 22 and the trailing squeegee 22 pushes the paste through the stencil apertures and cleans the stencil 17 behind the depositor 20. For a Rheometric pump depositor, solder paste is dispensed under pressure through the stencil apertures and a blade that is angled into the direction of travel cleans the solder paste from the stencil 17.

At stage 90, the work table 18 and the board 16 are rotated to again have the length 104 of the board 16 align with the direction of travel of the board 16, preferably by being rotated about 90° in the opposite direction from the rotation at stage 86 (i.e., −90°).

At stage 92, the circuit board 16 is output from the printer 10 by the rail output mechanism and the process 80 returns to stage 82 where another circuit board 16 is loaded.

Other embodiments are within the scope and spirit of the appended claims. For example, due to the nature of software, functions described above can be implemented using software, hardware, firmware, hardwiring, or combinations of any of these. Features implementing functions may also be physically located at various positions, including being distributed such that portions of functions are implemented at different physical locations. Further, while the description above focused on rotating the board 16 about 90° for printing, rotations of other amounts are possible. For example, the circuit board 16 could be rotated less than 90°, such as about any of 10°, 20°, 30°, 40°, 45°, 50°, 60°, 70°, or 80°, or any angle from about 10° to about 90° (in either direction). In at least these cases, the print window 106 may be oriented relative to the board 16 to facilitate printing when rotated the desired amount. Preferably, however, the board 16 is rotated at least 10°. Further, it has been assumed that the depositor 20 travels substantially perpendicular to the length 100 of the depositor 20. If the depositor 20 travels non-perpendicularly to the length 100 of the depositor 20, then the printable length of the depositor 20 will be reduced from that of the maximum printable length of the depositor 20 by an amount that depends on the angle of travel relative to the length of the depositor 20. In this case, the circuit board 16 is preferably rotated at least 90° if the length 108 of the print region 106 is larger than this actual, albeit less than maximum, printable length of the depositor 20. Further, blades or squeegees longer than the length 100 of the depositor 20 may be used, although these longer blades/squeegees may not increase the printable length of the depositor 20. These longer blades/squeegees may be angled with respect to the depositor length 100.

While typically a printable length of the printer 10 is the printable length of the depositor 20, the printable length of the printer 10 may be smaller than the printable length of the depositor 20. The printable length of the printer 10 is the shorter of the depositor's printable length and the length of the stencil foil (or other area in the stencil having apertures for receiving solder paste, e.g. a portion of the foil having the apertures) perpendicular to the print direction. Thus, the controller 24 can determine whether the print window length 108 is longer than the printer's printable length, and cause the table 18 to be rotated if the length 108 is longer than the printer's printable length.

What is claimed is:

1. A method of printing a circuit board of the type having top and bottom planar surfaces with solder paste using a solder printer, the method comprising:
    transporting the circuit board, that includes a print region disposed on the top planar surface that is to receive the solder paste, to a printing chamber of the solder printer along a first direction of travel;
    rotating the circuit board about an axis normal to the top planar surface having the print region of the circuit board by 90°;
    moving at least one of the circuit board and a stencil of the solder printer so that the circuit board and the stencil are in close proximity with the print region in a desired relationship with respect to the stencil; and
    printing the solder paste onto the circuit board by inserting the solder paste through the stencil onto the print region of the top surface of the circuit board.

2. The method of claim 1 further comprising pressing edges of the circuit board before the printing.

3. The method of claim 2 wherein the rotating is initially rotating, the method further comprising further rotating the circuit board after the printing such that the circuit board is oriented substantially similarly as the board was situated before the initial rotating.

4. The method of claim 3 wherein the further rotating rotates the board substantially 90° in a direction opposite to that of the initial rotating.

5. A method of printing a circuit board with solder paste using a solder printer, the method comprising:
    transporting the circuit board, that includes a print region that is to receive the solder paste, to a printing chamber of the solder printer along a first direction of travel;
    initially rotating the circuit board about 90°;
    moving at least one of the circuit board and a stencil of the solder printer so that the circuit board and the stencil are in close proximity with the print region in a desired relationship with respect to the stencil;
    pressing edges of the circuit board;
    printing the solder paste onto the circuit board by inserting the solder paste through the stencil onto the print region of the circuit board; and
    further rotating the circuit board after the printing such that the circuit board is oriented substantially similarly as the board was situated before the initial rotating,
    wherein the initial and further rotating are performed at a first speed that is faster than a second speed used to rotate the circuit board, if at all, to fine tune alignment of the circuit board with the stencil.

6. A method of printing a circuit board with solder paste using a solder printer, the method comprising:
    transporting the circuit board, that includes a print region that is to receive the solder paste, to a printing chamber of the solder printer along a first direction of travel;
    rotating the circuit board greater than about 45°;
    moving at least one of the circuit board and a stencil of the solder printer so that the circuit board and the stencil are in close proximity with the print region in a desired relationship with respect to the stencil;
    pressing edges of the circuit board;
    printing the solder paste onto the circuit board by inserting the solder paste through the stencil onto the print region of the circuit board; and
    determining whether a dimension of the print region substantially parallel to the first direction of travel is greater than a printable length associated with the printer, wherein the rotating is performed in response to determining that the dimension of the print region substantially parallel to the first direction of travel is greater than the printable length.

7. A method of printing at least two circuit boards with solder paste using a solder printer, the method comprising:
    transporting a first circuit board, that includes a print region that is to receive the solder paste, to a printing chamber of the solder printer along a first direction of travel;
    rotating the first circuit board greater than about 45°;
    moving at least one of the first circuit board and a stencil of the solder printer so that the first circuit board and the stencil are in close proximity with the print region in a desired relationship with respect to the stencil;
    printing the solder paste onto the first circuit board by inserting the solder paste through the stencil onto the print region of the first circuit board;
    receiving a second circuit board for printing;
    transporting the second circuit board, that includes a second print region that is to receive the solder paste, to the printing chamber of the solder printer along the first direction of travel;
    determining that a dimension of the second print region substantially parallel to the first direction of travel is no greater than the printable length associated with the printer;
    moving the second circuit board into close proximity with the stencil with the print region in a desired relationship with respect to the stencil without rotating the second circuit board more than about 45°; and
    printing the solder paste onto the second circuit board by inserting the solder paste through the stencil onto the second print region of the second circuit board.

* * * * *